United States Patent
Park (12)

(10) Patent No.: US 9,263,371 B2
(45) Date of Patent: Feb. 16, 2016

(54) SEMICONDUCTOR DEVICE HAVING THROUGH-SILICON VIA

(71) Applicant: SK hynix Inc., Gyeonggi-do (KR)

(72) Inventor: Heat-Bit Park, Gyeonggi-do (KR)

(73) Assignee: SK Hynix, Gyeonggi-do (KR)

( * ) Notice: Subject to any disclaimer, the term of this patent is extended or adjusted under 35 U.S.C. 154(b) by 0 days.

(21) Appl. No.: 14/303,286

(22) Filed: Jun. 12, 2014

(65) Prior Publication Data

US 2015/0206825 A1 Jul. 23, 2015

(30) Foreign Application Priority Data

Jan. 17, 2014 (KR) ........................ 10-2014-0006024

(51) Int. Cl.
*G11C 7/22* (2006.01)
*H01L 23/48* (2006.01)
*H01L 25/18* (2006.01)

(52) U.S. Cl.
CPC ................ *H01L 23/481* (2013.01); *G11C 7/22* (2013.01); *H01L 25/18* (2013.01); *H01L 2924/0002* (2013.01)

(58) Field of Classification Search
CPC .......... G11C 7/22; G11C 5/06; G11C 11/063; H01L 23/481; H01L 25/18; H01L 2924/0002; H01L 2924/00

USPC .......... 365/198, 51, 63, 130, 189.03, 189.14, 365/189.17, 189.18

See application file for complete search history.

(56) References Cited

U.S. PATENT DOCUMENTS

| | | | |
|---|---|---|---|
| 7,760,573 B2 * | 7/2010 | Shibata et al. | 365/226 |
| 8,441,831 B2 * | 5/2013 | Ku et al. | 365/63 |
| 8,575,996 B2 * | 11/2013 | Choi | 327/525 |
| 8,618,541 B2 * | 12/2013 | Yang et al. | 257/48 |
| 8,711,573 B2 * | 4/2014 | Gillingham | 361/790 |
| 8,902,680 B2 * | 12/2014 | Yamamoto | 365/189.12 |
| 2012/0212990 A1 * | 8/2012 | Park et al. | 365/63 |

FOREIGN PATENT DOCUMENTS

| | | |
|---|---|---|
| KR | 1020110138099 | 12/2011 |
| KR | 1020130081039 | 7/2013 |

* cited by examiner

*Primary Examiner* — Tan T Nguyen
(74) *Attorney, Agent, or Firm* — IP & T Group LLP

(57) ABSTRACT

A semiconductor device includes a through electrode vertically passing through the semiconductor device; a metal pad electrically coupling the through electrode and an exterior; a data input block suitable for transferring a data signal to the metal pad in response to a write command; a through electrode storage block suitable for storing the data signal transferred through the metal pad; and a data output block suitable for outputting the data signal, which is stored in the through electrode storage block, to the exterior in response to a read command.

19 Claims, 3 Drawing Sheets

SEMICONDUCTOR DEVICE HAVING THROUGH-SILICON VIA

CROSS-REFERENCE TO RELATED APPLICATIONS

The present application claims priority of Korean Patent Application No. 10-2014-0006024, filed on Jan. 17, 2014, which is incorporated herein by reference in its entirety.

BACKGROUND

1. Field

Various embodiments of the present invention relate to a semiconductor device, and more particularly, to a semiconductor device including a through-silicon via (TSV).

2. Description of the Related Art

Packaging technologies for semiconductor integrated circuits have continuously been developed to satisfy the demand for miniaturization and mounting reliability. As demand for miniaturization and high performance of electronic appliances increases, various techniques for a stacked package have been developed. In order to improve semiconductor device integration, a three-dimensional (3D) semiconductor device having a plurality of chips stacked in a single package has been developed. Recently, a TSV type semiconductor device has been disclosed in which TSVs are formed to pass through a plurality of stacked chips to provide an electrical connection.

TSVs and through electrodes are formed on the semiconductor chip to transfer electrical signals. In most applications, the semiconductor device has a master chip positioned lowermost and a plurality of slave chips stacked on the master chip. The master chip interfaces with an external controller that controls the plurality of slave chips using the through electrodes. The master chip may transfer address signals for accessing the rows/columns and banks of the slave chips, data signals, various command signals, internal/external power, and so forth, through the through electrodes.

A failure test for each of the slave chips is performed by writing data into a core region having a plurality of memory cells and then reading the written data from the core region. However, the failure test for the master chip is performed by latching data using a latch circuit and then outputting the latched data. In detail, as a write command is applied, a data signal from an external source is stored in the latch circuit of the master chip. Thereafter, as a read command is applied, the data signal stored in the latch circuit is outputted to the exterior through the through electrode. During the read operation, because data is outputted through the through electrode, data is not likely to fully swing due to the capacitance of the through electrode, the low operating voltage, and the high speed operating conditions.

SUMMARY

Various embodiments are directed to a semiconductor device in which the data latched by a master chip in a test mode for determining whether the semiconductor device is failed or passed may be outputted without being influenced by the capacitance of a through electrode.

In an embodiment, a semiconductor device may include: a through electrode vertically passing through the semiconductor device; a metal pad electrically coupling the through electrode and an exterior (e.g. to an external device; externally); a data input block suitable for transferring a data signal to the metal pad in response to a write command; a through electrode storage block suitable for storing the data signal transferred through the metal pad; and a data output block suitable for outputting the data signal, which is stored in the through electrode storage block, to the exterior in response to a read command.

In an embodiment, a semiconductor device may include: a master chip and a plurality of slave chips stacked on the master chip; a plurality of through electrodes vertically passing through the master chip and the plurality of slave chips; and a plurality of metal pads electrically coupling the plurality of through electrodes and an exterior, wherein the master chip may include: a data input block suitable for transferring a data signal to one or more of the multiple metal pads in response to a write command; a through electrode storage block suitable for storing the data signal transferred through the one or more of the multiple metal pads; and a data output block suitable for outputting the data signal, which is stored in the through electrode storage block, to the exterior in response to a read command.

In an embodiment, a semiconductor device may include: a master chip and a plurality of slave chips stacked on the master chip; a plurality of through electrodes vertically passing through the master chip and the plurality of slave chips; and a plurality of metal pads electrically coupling the plurality of through electrodes and an exterior, wherein the master chip may include: a data input block suitable for transferring a data signal to one or more of the multiple metal pads in response to a write command; a through electrode storage block suitable for storing the data signal transferred through the one or more of the multiple metal pads; and a data output block suitable for outputting the data signal, which is stored in the through electrode storage block, to the exterior when a data output signal is activated, wherein each of the multiple slave chips has a core block suitable for storing the data signal transferred from the data input block through one or more of the multiple metal pads, wherein the data output block further outputs the data signal, which is stored in the core block, to the exterior when the data output signal is deactivated, and wherein the data output signal is generated by a read command.

In an embodiment, a method for operating a semiconductor device, including a master chip and a plurality of slave chips stacked on the master chip, a plurality of through electrodes vertically passing through the master chip and the plurality of slave chips, a plurality of metal pads electrically coupling the plurality of through electrodes and an exterior, a through electrode storage block included in the master chip, and core blocks respectively included in the plurality of slave chips, may include: transferring a data signal applied from the exterior or is internally generated, to the metal pads in response to a write command; transferring the data signal transferred through the metal pad, to the through electrode storage block, and storing it therein; and outputting the data signal stored in the through electrode storage block, to the exterior in response to a read command.

In an embodiment, a semiconductor device may include: one or more stacked slave chips, each of which stores input data inputted through one or more through electrodes therein; and a master chip electrically coupled to the stacked slave chips through the through electrodes, wherein the master chip may include: a storage unit suitable for storing the input data; and an output unit suitable for alternately outputting the input data stored in the stacked slave chips and the storage unit to an external in response to first and second control signals, which are alternately enabled.

DETAILED DESCRIPTION

Figure 1:
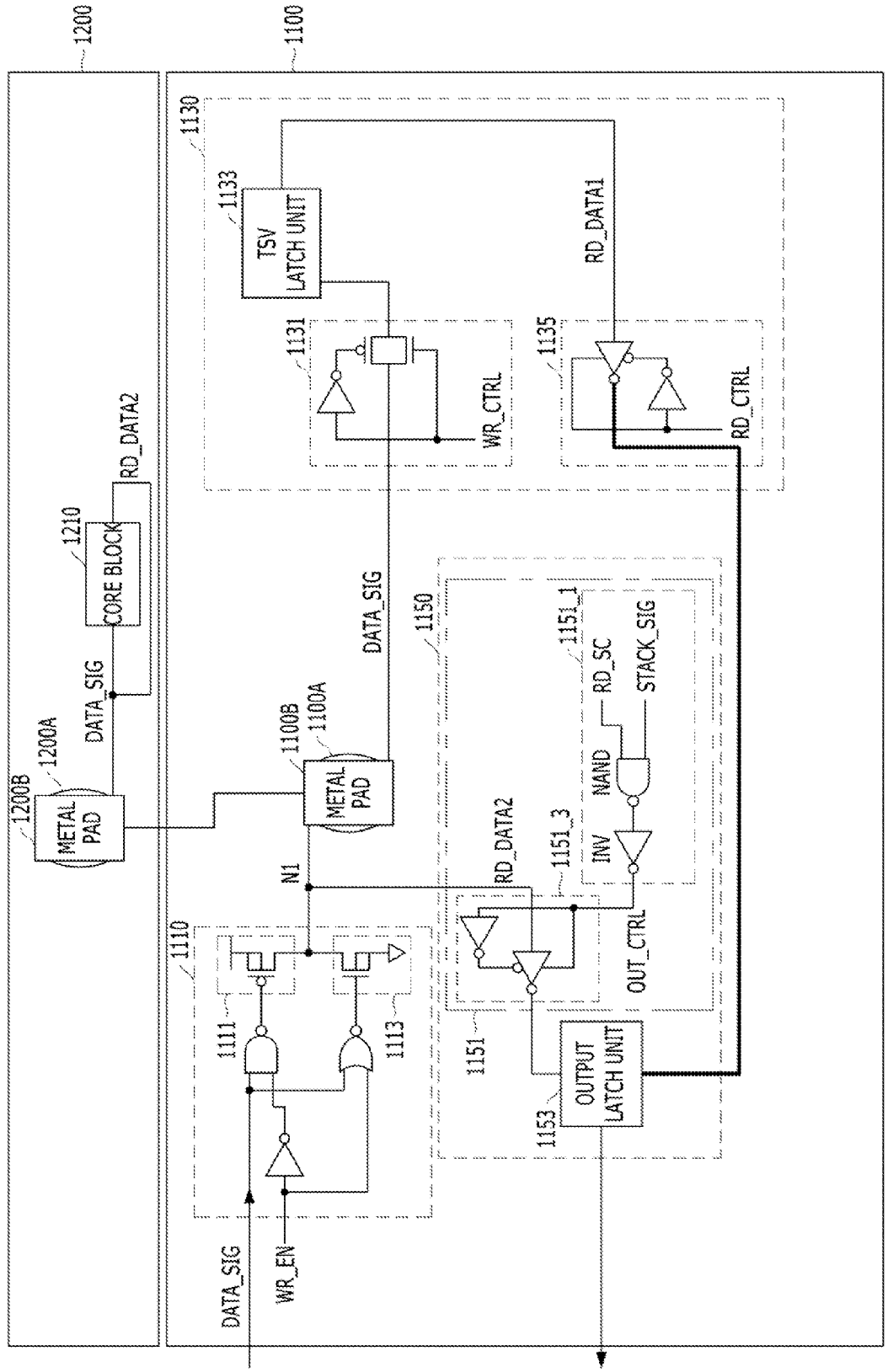
FIG. 1 is a block diagram illustrating a semiconductor device in accordance with a first embodiment of the present disclosure.

Various embodiments will be described below in more detail with reference to the accompanying drawings. The present invention in may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a semiconductor device in accordance with a first embodiment of the present disclosure.

For reference, while respective semiconductor chips are shown in plan view style for the sake of convenience, it is to be noted that the present disclosure actually has a structure in which a plurality of slave chips are stacked on a master chip.

Referring to FIG. 1, the semiconductor device may include a master chip 1100 and a plurality of slave chips 1200 stacked on the master chip 1100. The master chip 1100 and the plurality of slave chips 1200 may include a plurality of through electrodes 1100A and 1200A formed vertically therethrough, respectively. The master chip 1100 and the plurality of slave chips 1200 may further include a plurality of metal pads 1100B and 1200B connected between the plurality of through electrodes 1100A and 1200B and an exterior, respectively. The metal pads 1100B and 1200B may be formed on the through electrodes 1100A and 1200A of the respective semiconductor chips 1100 and 1200. The metal pads 1100B and 1200B may be formed to cover the ends of the through electrodes 1100A and 1200A, and may be electrically connected with the internal circuits of the semiconductor chips 1100 and 1200. Accordingly, internal circuits of the semiconductor chips 1100 and 1200 may receive and transmit signals through the through electrodes 1100A and 1200A and the metal pads 1100B and 1200B. Each of the plurality of slave chips 1200 may further include a core block 1210 electrically coupled to the metal pad 1100B. For illustration, the master chip and one slave chip are shown in the present embodiment. This is because all the detailed component elements of the plurality of slave chips are the same, so only one slave chip stacked on the master chip will be described.

The master chip 1100 may further include a data input block 1110, a through electrode storage block 1130, and a data output block 1150. The data input block 1110 may transfer a data signal DATA_SIG to the metal pads 1100B and 1200B in response to a write enable signal WR_N generated by a write command. The data signal DATA_SIG may be applied from the exterior or internally generated. The data signal DATA_SIG may be transferred to the through electrode storage block 1130 of the master chip 1100 and the core block 1210 of the slave chip 1200. The slave chip 1200 may receive the data signal DATA_SIG through the metal pad 1200B and the through electrode 1200A, and store it in the core block 1210. For reference, when a test is to be performed at a wafer level, the data signal DATA_SIG may be transferred to only the through electrode storage block 1130 of the master chip 1100.

In response to the write enable signal WR_EN, the data input block 1110 may output a high level signal to a node N1 connected with the metal pads 1100B and 1200B, through a pull-up unit 1111 when the data signal DATA_SIG is a high level, and may output a low level signal to the node N1 through a pull-down unit 1113 when the data signal DATA_SIG is a low level. For reference when testing the semiconductor device in the package state, the data input block 1110 may transfer the data signal DATA_SIG to a node connected with the plurality of metal pads provided in a plurality of slave chips.

The through electrode storage block 1130 may include a data signal transfer unit 1131, a TSV latch unit 1133, and a data transfer unit 1135. Unlike the slave ship 1200 having the core block 1210 for storing the data signal DATA_SIG, the master chip 1100 may include the TSV latch unit 1133 for storing the data signal DATA_SIG. The through electrode storage block 1130 may store the data signal DATA_SIG transferred through the metal pad 1100B in response to a data storage signal WR_CTRL, which is activated a predetermined time after the activation of the write enable signal WR_EN.

The data signal transfer unit 1131 may electrically connect the metal pad 1100B and the TSV latch unit 1133 in response to the enabled data storage signal WR_CTRL, and transfer the data signal DATA_SIG to the TSV latch unit 1133. The TSV latch unit 1133 may latch the data signal DATA_SIG when the data storage signal WR_CTRL is activated. The data signal transfer unit 1131 may include a pass gate, and may be turned on in response to the enabled data storage signal WR_CTRL. Accordingly, the TSV latch unit 1133 may receive and store the data signal DATA_SIG transmitted through the metal pad 1100B and may retain the level of the stored data signal DATA_SIG when the data storage signal WR_CTRL is enabled. The latched data signal DATA_SIG may be referred to as first data RD_DATA1 in this disclosure.

The data transfer unit 1135 may transmit the first data RD_DATA1 to the output latch unit 1153 of the data output block 1150 in response to a data output signal RD_CTRL generated by a read command. The data transfer unit 1135 may include a tri-state inverter, which may transfer the first data RD_DATA1 to the output latch unit 1153 in response to the enabled data output signal RD_CTRL.

The data output block 1150 transfers the first data RD_DATA1 as the data signal DATA_SIG to the exterior (externally, or to an external device) in response to the data output signal RD_CTRL generated by the read command. The data output block 1150 may transfer the first data RD_DATA1 directly from the through electrode storage block 1130 without intervention of the metal pad 1100B. Unlike existing semiconductor devices that output a data signal through a metal pad, which transfers the data signal to an internal circuit, the semiconductor device in accordance with an embodiment of the present disclosure may transfer the data signal through a separate pad other than the metal pad 1100B formed on the through electrode 1100A for transferring the data signal.

The data output block 1150 may include an output control unit 1151 and an output latch unit 1153. The output control unit 1151 may include an output control signal generating section 1151_1 and a data transfer section 1151_1. The output latch unit 1153 may latch the first data RD_DATA1 transferred from the through electrode storage block 1130. Further, the output latch unit 1153 may latch second data RD_DATA2, which is the data signal DATA_SIG stored in the core block 1210 and transmitted through the through electrode 1200A. The output latch unit 1153 may output the first and second data RD_DATA1 and RD_DATA2 as the data signal DATA_SIG.

The output control unit 1151 may block the transfer of the second data RD_DATA2 to the output latch unit 1153 while the first data RD_DATA1 is transferred to the output latch unit 1153. The output control unit 1151 may prevent the collision of the first data RD_DATA1 transmitted from the master chip 1100 and the second data RD_DATA2 transmitted from the core block 1210.

The output control signal generating section 1151_1 may generate an output control signal OUT_CTRL in response to a read source signal RD_SC, which is activated a predetermined time after the activation of the data output signal RD_CTRL, and a stack signal STACK_SIG. The stack signal STACK_SIG may have package information. For example, the stack signal STACK_SIG with a high level may be generated in the stacked state in which a plurality of slave chips may be stacked on the master chip 1100 and a collision may occur between the data outputted from the multiple slave chips and the master chip 110 at a read time, and the stack signal STACK_SIG with a low level may be generated in a non-stacked state. The stack signal STACK_SIG may control the read operation of the master chip 1100 during a test operation.

The output control signal generating section 1151_1 may control the data transfer section 1151_3 to prevent the collision of the first data RD_DATA1 and the second data RD_DATA2 by transferring the read source signal RD_SC as the output control signal OUT_CTRL to an output control unit 1151 using the stack signal STACK_SIG. In the output control signal generating section 1151_1, the read source signal RD_SC and the stack signal STACK_SIG may be inputted to a NAND gate NAND. The signal outputted from the NAND gate NAND may be inputted to the data transfer section 1151_3 through an inverter INV. The stack signal STACK_SIG may be applied as a high level signal in the stacked state, and become a floating node state and may be applied as a low level signal in the non-stacked state. The stack signal STACK_SIG having the low level may make the output control signal OUT_CTRL disabled.

The data transfer section 1151_3 may transfer the second data RD_DATA2 to the output latch unit 1153 in response to the output control signal OUT_CTRL. The data transfer section 1151_3 may include a tri-state inverter. When the output control signal OUT_CTRL is enabled, the data transfer section 1151_3 may output the second data RD_DATA2 to the output latch unit 1153. The stack signal STACK_SIG having the low level may disable the output control signal OUT_CTRL and therefore the transfer of the second data RD_DATA2 to the output latch unit 1153 may be blocked.

Namely, when the read command is applied to the semiconductor device, and thus the data output signal RD_CTRL is enabled, the output latch unit 1153 may transfer the first data RD_DATA1, which comes from the through electrode storage block 1130 of the master chip 1100, to the output latch unit 1153 while the data transfer section 1151_3 blocks the output of the second data RD_DATA2, which comes from the core block 1210 of the slave chip 1200, to the output latch unit 1153 according to the disabled output control signal OUT_CTRL. Thereafter, when the output control signal OUT_CTRL is activated a predetermined time after the activation of the data output signal RD_CTRL, the output latch unit 1153 may latch and output the second data RD_DATA2 transferred through the data transfer section 1151_3. By comparing the data signal DATA_SIG outputted from the output latch unit 1153 to the exterior with the data signal DATA_SIG inputted to the data input block 1110, it is possible to determine whether either the master chip 1100 or the multiple slave chips 1200 have failed.

Hereafter, operations of the semiconductor device will be described below. The data input block 1110 may transfer the data signal DATA_SIG, which is applied from the exterior or internally generated, to the metal pads 1100B and 1200B in response to the write enable signal WR_EN generated by the write command. The data signal DATA_SIG transferred to the metal pad 1100B of the master chip 1100 may be applied to the through electrode storage block 1130. The data signal DATA_SIG transferred to the metal pad 1200B of the slave chip 1200 may be transmitted to the core block 1210 through the through electrode 1200A. In the through electrode storage block 1130, the data signal transfer unit 1131 may transfer the data signal DATA_SIG to the TSV latch unit 1133 in response to the data storage signal WR_CTRL generated the predetermined time after the activation of the write enable signal WR_EN, and the TSV latch unit 1133 may latch the data signal DATA_SIG as the first data RD_DATA1. Further, the core block 1210 may receive the data signal DATA_SIG through the through electrode 1200A and store it as the second data RD_DATA2.

Next, the first data RD_DATA1 latched by the TSV latch unit 1133 may be outputted to the output latch unit 1153 in response to the data output signal RD_CTRL generated by the read command. When the output control signal OUT_CTRL is activated by the output control unit 1151, a predetermined time after the activation of the data output signal RD_CTRL, the second data RD_DATA2 stored in the core block 1210 of the slave chip 1200 may be outputted through the through electrode 1200A. Therefore, the first data RD_DATA1 latched by the through electrode storage block 1130 of the master chip 1100 may be outputted to the exterior directly from the data output block 1150 without intervention of the metal pad 1100B. In other words, because the first data RD_DATA1 of the through electrode storage block 1130 does not pass through the metal pad 1100B formed on the through electrode 1100A when it is outputted, the first data RD_DATA1 may be not influenced by the capacitance of the through electrode 1100A.

Figure 2:
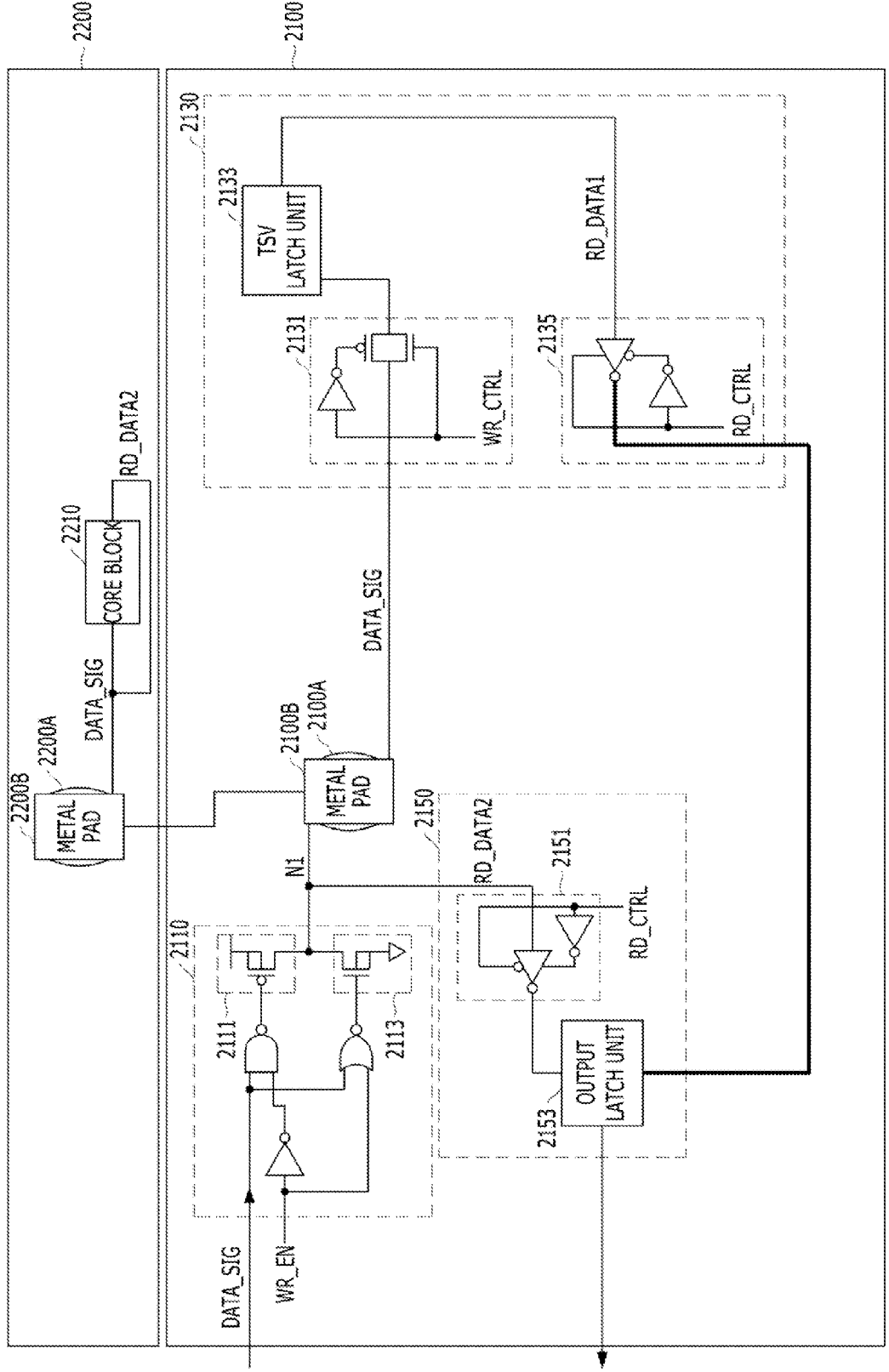
FIG. 2 is a block diagram illustrating a semiconductor device in accordance with a second embodiment of the present disclosure.

FIG. 2 is a block diagram illustrating a semiconductor device in accordance with a second embodiment of the present disclosure.

The semiconductor device shown in FIG. 2 is the same as the semiconductor device described above with reference to FIG. 1, except that the semiconductor device shown in FIG. 2 may use a data output signal RD_CTRL to control a second data transfer unit 2151, instead of using the output control signal OUT_CTRL and the output control signal generating section 1151_1 generating the output control signal OUT_CTRL in order to control the data transfer section 1151_3 described above with reference to FIG. 1. The second data transfer unit 2151 may correspond to the data transfer section 1151_3.

The second data transfer unit 2151 may transfer the second data RD_DATA2 to the output latch unit 2153 while the data output signal RD_CTRL is deactivated and thus a first data transfer unit 2135, which corresponds to the data transfer unit 1135 described above with reference to FIG. 1, blocks the transfer of the first data RD_DATA1 to the output latch unit 2153. The second data transfer unit 2151 may include a tri-state inverter. The second data transfer unit 2151 may output the second data RD_DATA2 to the output latch unit 2153 when the data output signal RD_CTRL is disabled and thus the first data transfer unit 2135 blocks the transfer of the first data RD_DATA1 to the output latch unit 2153. When the data output signal RD_CTRL is enabled and thus the first data transfer unit 2135 transfers the first data RD_DATA1 to the output latch unit 2153, the second data transfer unit 2151 may block the output of the second data RD_DATA2 to the output latch unit 2153.

In conventional semiconductor devices, to improve the driving capability during the data read operation, an increase in the layout area of the master chip is required. In the semiconductor device in accordance with the embodiments of the present disclosure, it is possible to secure high driving capability without an increase of the layout area since the data latched by the master chip may fully swing even at a low voltage or during high speed operations, and a data output operation may be stably performed.

Figure 3A:
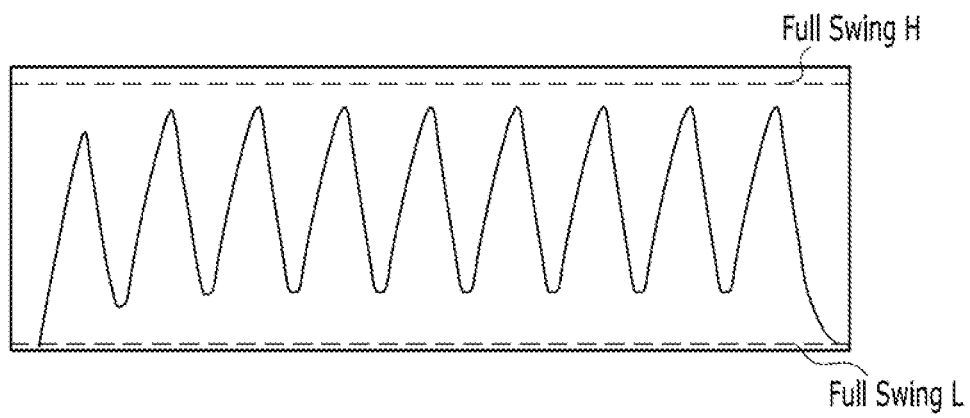
FIGS. 3A and 3B are waveform diagrams illustrating output of a semiconductor device in accordance with the embodiments of the present disclosure.
Figure 3B:
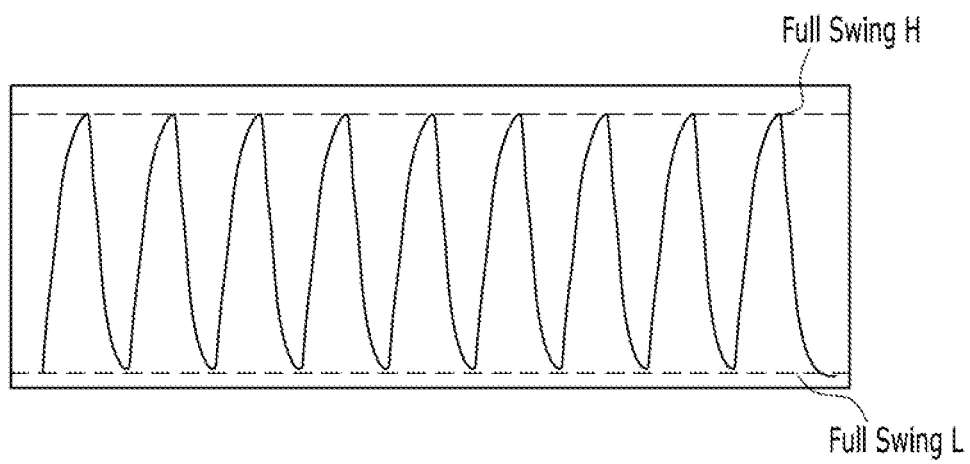

FIGS. 3A and 3B are waveform diagrams illustrating the output of the semiconductor devices, one in accordance with the embodiments of the present disclosure.

FIG. 3A shows the waveform of the output signal of a conventional semiconductor device. As shown in FIG. 3A, due to the capacitance of a through electrode under low voltage, the signal slope improvement effect is poor even though a high driving force is used in a conventional semiconductor device.

FIG. 3B shows the waveform of the output signal of a semiconductor device in accordance with the embodiments of the present disclosure, As shown in FIG. 3B, the output signal fully swings even under low voltage since data is not influenced by the capacitance of a through electrode. Therefore, it is possible to increase the driving force of an output signal even under low voltage without increasing the layout area of a semiconductor device for data transfer.

As is apparent from the above descriptions, in the semiconductor device in accordance with the embodiments of the present disclosure, since the data latched by a master chip may be outputted without influence from the capacitance of a through electrode, data may be stably outputted at low voltage or high speed, and it is possible to secure high driving force without increasing a layout area.

Although various embodiments have been described for illustrative purposes, it will be apparent to those skilled in the art that various changes and modifications may be made without departing from the spirit and scope of the invention as defined in the following claims.

For instance, the positions and kinds of the logic gates and transistors exemplified in the above-described embodiments could be differently realized according to the polarities of the signals inputted thereto.

What is claimed is:

1. A semiconductor device comprising:
    a through electrode vertically passing through the semiconductor device;
    a metal pad suitable for electrically coupling the through electrode and an exterior;
    a data input block suitable for transferring a data signal to the metal pad in response to a write command;
    a through electrode storage block, electrically coupled to the metal pad, suitable for storing the data signal transferred through the metal pad in response to a data storage signal, which is activated in a predetermined time after an activation of the write command; and
    a data output block suitable for outputting the data signal that is stored in the through electrode storage block to the exterior in response to a read command.

2. The semiconductor device according to claim 1, wherein the data output block receives the data signal directly from the through electrode storage block.

3. The semiconductor device according to claim 1, wherein the through electrode storage block comprises:
    a TSV latch unit suitable for latching the data signal;
    a data signal transfer unit suitable for transferring the data signal from the metal pad to the TSV latch unit in response to a data storage signal generated by the write command; and
    a data transfer unit suitable for transferring the data signal from the TSV latch unit to the data output block in response to a data output signal generated by the read command.

4. The semiconductor device according to claim 3 wherein the data storage signal is activated a predetermined time after input of the write command, and the data signal is latched by the TSV latch unit in response to the activated data storage signal.

5. A semiconductor device comprising:
    a master chip and a plurality of slave chips stacked on the master chip;
    a plurality of through electrodes passing through the master chip and the plurality of slave chips; and
    a plurality of metal pads suitable for electrically coupling the plurality of through electrodes and an exterior,
    wherein the master chip comprises:
        a data input block suitable for transferring a data signal to one or more of the multiple metal pads in response to a write command;
        a through electrode storage block, electrically coupled to the plurality of metal pads, suitable for storing the data signal transferred through the one or more of the multiple metal pads in response to a data storage signal, which is activated in a predetermined time after an activation of the write command; and
        a data output block suitable for outputting the data signal that is stored in the through electrode storage block to the exterior in response to a read command.

6. The semiconductor device according to claim 5, wherein each of the plurality of slave chips comprises a core block suitable for storing the data signal transferred from the data input block through one or more of the multiple through electrode(s).

7. The semiconductor device according to claim 6, wherein the through electrode storage block comprises:
    a TSV latch unit suitable for latching the data signal;
    a data signal transfer unit suitable for transferring the data signal from the one or more of the multiple metal pads to the TSV latch unit in response to a data storage signal generated by the write command; and
    a data transfer unit suitable for transferring the data signal from the TSV latch unit to the data output block in response to a data output signal generated by the read command.

8. The semiconductor device according to claim 7, wherein the data storage signal is activated a predetermined time after input of the write command, and the TSV latch unit latches the data signal in response to the activated data storage signal.

9. The semiconductor device according to claim 7, wherein the data output block comprises:
    an output latch unit suitable for latching the data signal transferred from the data transfer unit and from the core block; and
    an output control unit suitable for blocking transfer of the data signal, which is transferred from the core block, to the output latch unit while the data signal, which is transferred from the through electrode storage block, is transferred to the output latch unit.

10. The semiconductor device according to claim 9, wherein the output control unit comprises:
an output control signal generating section suitable for generating an output control signal in response to a read source signal that is activated a predetermined time after the activation of the data output signal; and
a data transfer section suitable for transferring the data signal from the core block to the output latch unit in response to the output control signal.

11. A semiconductor device comprising:
a master chip and a plurality of slave chips stacked on the master chip;
a plurality of through electrodes passing through the master chip and the plurality of slave chips; and
a plurality of metal pads electrically coupling the plurality of through electrodes and an exterior,
wherein the master chip comprises:
a data input block suitable for transferring a data signal to one or more of the multiple metal pads in response to a write command;
a through electrode storage block suitable for storing the data signal transferred through the one or more of the multiple metal pads; and
a data output block suitable for outputting the data signal, which is stored in the through electrode storage block, to the exterior when a data output signal is activated,
wherein each of the multiple slave chips has a core block suitable for storing the data signal transferred from the data input block through one or more of the multiple metal pads,
wherein the data output block further outputs the data signal, which is stored in the core block, to the exterior when the data output signal is deactivated, and
wherein the data output signal is generated by a read command.

12. The semiconductor device according to claim 11, wherein the through electrode storage block comprises:
a TSV latch unit suitable for latching the data signal;
a data signal transfer unit suitable for transferring the data signal from the one or more of the metal pads to the TSV latch unit in response to a data storage signal generated by the write command; and
a first data transfer unit suitable for transferring the data signal from the TSV latch unit to the data output block in response to the data output signal.

13. The semiconductor device according to claim 12, wherein the data storage signal is activated a predetermined time after input of the write command, and the TSV latch unit latches the data signal in response to the activated data storage signal.

14. The semiconductor device according to claim 12, wherein the data output block comprises:

an output latch unit suitable for latching the data signal transferred from the first data transfer unit and from the core block; and
a second data transfer unit suitable for transferring the data signal that is transferred from the core block to the output latch unit when the data output signal is deactivated.

15. A method for operating semiconductor device comprising a master chip and a plurality of slave chips stacked on the master chip, a plurality of through electrodes passing through the master chip and the plurality of slave chips, a plurality of metal pads suitable for electrically coupling the plurality of through electrodes and an exterior, a through electrode storage block included in the master chip, and core blocks included in the plurality of slave chips, the method comprising:
transferring a data signal that is inputted from the exterior, or internally generated, to the metal pads in response to a write command;
transferring the data signal through the metal pad to the through electrode storage block, and storing it therein; and
outputting the data signal stored in the through electrode storage block to the exterior in response to a read command,
wherein the outputting of the data signal goes directly from the through electrode storage block to the exterior.

16. The method according to claim 15, wherein the transferring of the data signal to the metal pads comprises storing the data signal that is inputted to the metal pads in the core blocks of the plurality of slave chips through the through electrodes.

17. The method according to claim 16, wherein the outputting of the data signal comprises blocking output of the data signal, that is transferred from the core blocks, while the data signal, that is transferred from the through electrode storage block, is outputted.

18. A semiconductor device comprising:
one or more stacked slave chips, each of which stores input data inputted through one or more through electrodes therein; and
a master chip electrically coupled to the stacked slave chips through the through electrodes,
wherein the master chip comprises:
a storage unit suitable for storing the input data; and
an output unit suitable for alternately outputting the input data, that is stored in the stacked slave chips and the storage unit, externally in response to first and second control signals that are alternately enabled.

19. The semiconductor device of claim 18, wherein the input data stored in the storage unit is transferred directly from the storage unit to the output unit.

* * * * *

UNITED STATES PATENT AND TRADEMARK OFFICE
CERTIFICATE OF CORRECTION

PATENT NO. : 9,263,371 B2  
APPLICATION NO. : 14/303286  
DATED : February 16, 2016  
INVENTOR(S) : Heat-Bit Park Page 1 of 1

It is certified that error appears in the above-identified patent and that said Letters Patent is hereby corrected as shown below:

Change the Assignee section as follows:

(73)    Assignee:   SK Hynix Inc., Gyeonggi-do (KR)

Signed and Sealed this  
Third Day of May, 2016

Michelle K. Lee  
*Director of the United States Patent and Trademark Office*